United States Patent
Li et al.

(10) Patent No.: US 12,538,637 B2
(45) Date of Patent: Jan. 27, 2026

(54) QUANTUM DOT LIGHT-EMITTING DIODE DEVICE AND MANUFACTURING METHOD THEREOF, AND DISPLAY PANEL

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Dong Li, Beijing (CN); Boris Kristal, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 566 days.

(21) Appl. No.: 17/802,564

(22) PCT Filed: May 21, 2021

(86) PCT No.: PCT/CN2021/095172
§ 371 (c)(1),
(2) Date: Aug. 26, 2022

(87) PCT Pub. No.: WO2022/001470
PCT Pub. Date: Jan. 6, 2022

(65) Prior Publication Data
US 2023/0078114 A1 Mar. 16, 2023

(30) Foreign Application Priority Data
Jun. 30, 2020 (CN) .......................... 202010619865.1

(51) Int. Cl.
*H10K 50/115* (2023.01)
*H10K 50/16* (2023.01)
(Continued)

(52) U.S. Cl.
CPC ........... *H10K 50/115* (2023.02); *H10K 50/16* (2023.02); *H10K 59/122* (2023.02); *H10K 50/813* (2023.02)

(58) Field of Classification Search
None
See application file for complete search history.

(56) References Cited

U.S. PATENT DOCUMENTS

| 10,186,677 B2 | 1/2019 | Meng |
| 11,031,450 B2 | 6/2021 | Kim |
(Continued)

FOREIGN PATENT DOCUMENTS

| CN | 101237011 A | 8/2008 |
| CN | 105679958 A | 6/2016 |
(Continued)

OTHER PUBLICATIONS

CN-107611272-A, machine translation (Year: 2018).*
(Continued)

*Primary Examiner* — Hung K Vu
(74) *Attorney, Agent, or Firm* — Chiwin Law LLC

(57) ABSTRACT

Disclosed are a light-emitting diode (LED) device, a manufacturing method thereof, and a display panel. The LED device includes a base substrate, a first electrode layer, an electron transport layer, a quantum dot light-emitting layer and a second electrode layer. The first electrode layer is laminated on the base substrate; the electron transport layer is laminated on a surface of the first electrode layer away from the base substrate; the quantum dot light-emitting layer is laminated on a surface of the electron transport layer away from the first electrode layer; the second electrode layer is laminated on the surface of the quantum dot light-emitting layer away from the electron transport layer; wherein the surface of the electron transport layer away from the first (Continued)

electrode layer is a first concave-convex surface including a plurality of protrusions.

14 Claims, 10 Drawing Sheets

(51) Int. Cl.
  *H10K 59/122* (2023.01)
  *H10K 50/813* (2023.01)

(56) References Cited

U.S. PATENT DOCUMENTS

| | | |
|---|---|---|
| 11,094,907 B2 | 8/2021 | Fang et al. |
| 2017/0186985 A1 | 6/2017 | Kim et al. |
| 2020/0075699 A1* | 3/2020 | Kim ................. H10K 59/80515 |

FOREIGN PATENT DOCUMENTS

| | | | |
|---|---|---|---|
| CN | 106410055 A | | 2/2017 |
| CN | 106654027 A | | 5/2017 |
| CN | 107293647 A | | 10/2017 |
| CN | 107611272 A | * | 1/2018 |
| CN | 107681059 A | | 2/2018 |
| CN | 108232023 A | | 6/2018 |
| CN | 109873018 A | | 6/2019 |
| CN | 110875438 A | | 3/2020 |
| CN | 111326664 A | | 6/2020 |

OTHER PUBLICATIONS

First Office Action of the corresponding Chinese Application No. 202010619865.1 with search report.
Second Office Action of the corresponding Chinese Application No. 202010619865.1 with search report.

* cited by examiner

QUANTUM DOT LIGHT-EMITTING DIODE DEVICE AND MANUFACTURING METHOD THEREOF, AND DISPLAY PANEL

CROSS-REFERENCE TO RELATED APPLICATIONS

The present application claims priority to Chinese Patent Application No. 202010619865.1 filed on Jun. 30, 2020, the entire disclosure of which is incorporated herein by reference as part of the present application for all purposes.

TECHNICAL FIELD

Embodiments of the present disclosure relate to a light-emitting diode device, a manufacturing method thereof and a display panel.

BACKGROUND

With the continuous development of display technology, there are more and more types of display devices. Light-emitting Diode (LED) display device has attracted wide attentions in the industry because of its advantageous such as self-illumination, high brightness, low working voltage, low power consumption, long service life, impact resistance and stable performance. Furthermore, because LED display device does not need to be additionally provided with a backlight module, it has a lighter weight, which is beneficial to thinning the display device, so it has a better market prospect.

Quantum dots (QDs) are semiconductor nanocrystals that can be processed in solution. They have the advantages of narrow emission spectrum, controllable emission wavelength and high spectral purity, and are expected to become the core part of the next generation of light-emitting devices. Quantum Dot Light-emitting Diodes (QLED) use quantum dots as preparation materials of a light-emitting layer, and apply a voltage difference between electrodes at both sides of the light-emitting layer so that the light-emitting layer emits light, thus obtaining light with required wavelength. Therefore, Quantum Dot Light-emitting Diode (QLED) with quantum dot material as light-emitting layer has become one of the main research directions of new display devices.

SUMMARY

Embodiments of the present disclosure provides a light-emitting diode (LED) device, a manufacturing method thereof and a display panel. The structure of the LED device includes: a base substrate, a first electrode layer laminated on the base substrate, an electron transport layer laminated on the first electrode layer, a quantum dot light-emitting layer laminated on the electron transport layer, and a second electrode layer laminated on the quantum dot light-emitting layer, wherein a surface of the electron transport layer in contact with the quantum dot light-emitting layer is a concave-convex surface. Therefore, by increasing a contact area between the electron transport layer and the quantum dot light-emitting layer, the problem of unbalanced carrier injection in the quantum dot light-emitting layer caused by less electron injection can be solved, and the problem of Auger recombination of excitons in the quantum dot light-emitting layer can also be solved.

At least one embodiment of the present disclosure provides a light-emitting diode device, including: a base substrate; a first electrode layer laminated on the base substrate; an electron transport layer laminated on a surface of the first electrode layer away from the base substrate; a quantum dot light-emitting layer laminated on a surface of the electron transport layer away from the first electrode layer; and a second electrode layer laminated on a surface of the quantum dot light-emitting layer away from the electron transport layer; wherein the surface of the electron transport layer away from the first electrode layer is a first concave-convex surface including a plurality of protrusions.

For example, in the light-emitting diode device provided by at least one embodiment of the present disclosure, a root-mean-square surface roughness of the first concave-convex surface ranges from 5 nm to 10 nm.

For example, in the light-emitting diode device provided by at least one embodiment of the present disclosure, a height of the plurality of protrusions included in the first concave-convex surface in a direction perpendicular to the base substrate ranges from 1 nm to 10 nm.

For example, in the light-emitting diode device provided by at least one embodiment of the present disclosure, the surface of the first electrode layer away from the base substrate is a second concave-convex surface including a plurality of protrusions.

For example, in the light-emitting diode device provided by at least one embodiment of the present disclosure, the first electrode layer includes a first electrode sub-layer and conductive nanoparticles disposed on the first electrode sub-layer, and the conductive nanoparticles constitute the plurality of protrusions of the second concave-convex surface.

For example, in the light-emitting diode device provided by at least one embodiment of the present disclosure, the plurality of protrusions included in the second concave-convex surface have the same shape as the plurality of protrusions included in the first concave-convex surface, and the plurality of protrusions included in the second concave-convex surface have the same height as the plurality of protrusions included in the first concave-convex surface in a direction perpendicular to the base substrate.

For example, in the light-emitting diode device provided by at least one embodiment of the present disclosure, the electron transport layer includes a doped zinc oxide film doped with magnesium ions and trivalent metal ions.

For example, in the light-emitting diode device provided by at least one embodiment of the present disclosure, the trivalent metal ions are aluminum ions; in the doped zinc oxide film, a mass percentage of doped magnesium ions is 0.5%-20%, and a mass percentage of doped aluminum ions is 0.5%-10%.

For example, in the light-emitting diode device provided by at least one embodiment of the present disclosure, the electron transport layer includes N+1 electron transport sub-layers and N electron blocking sub-layers, the N electron blocking sub-layers are sandwiched between the N+1 electron transport sub-layers, and N is a positive integer greater than or equal to 2, and among the N+1 electron transport sub-layers, a surface of the electron transport sub-layer farthest from the base substrate that is away from the base substrate is the first concave-convex surface, and materials of the N+1 electron transport sub-layers are the same, and materials of the N electron blocking sub-layers are different from the materials of the N+1 electron transport sub-layers.

At least one embodiment of the present disclosure also provides a display panel, including: a base substrate; and a plurality of sub-pixels arranged in an array on the base substrate, wherein each of the plurality of sub-pixels includes the light-emitting diode device described in any of the above, the display panel further includes a pixel defining layer, wherein the pixel defining layer is arranged on the surface of the electron transport layer away from the base substrate and includes a plurality of openings, wherein the pixel defining layer at least partially covers an edge of the electron transport layer, the plurality of openings respectively expose a middle part of the electron transport layer, and the quantum dot light-emitting layer is arranged at least in the plurality of openings.

At least one embodiment of the present disclosure also provides a manufacturing method of a light-emitting diode device, including: providing a base substrate; forming a first electrode layer on the base substrate; forming an electron transport layer on a surface of the first electrode layer away from the base substrate; forming a quantum dot light-emitting layer on a surface of the electron transport layer away from the first electrode layer; and forming a second electrode layer on a surface of the quantum dot light-emitting layer away from the electron transport layer, wherein forming the electron transport layer includes: forming the surface of the electron transport layer away from the first electrode layer into a first concave-convex surface including a plurality of protrusions.

For example, in the manufacturing method provided by at least one embodiment of the present disclosure, forming the surface of the electron transport layer away from the first electrode layer into a first concave-convex surface including a plurality of protrusions includes: forming a first electrode layer including a first electrode sub-layer and a second electrode sub-layer laminated in sequence on the base substrate, and forming a surface of the second electrode sub-layer away from the base substrate into a second concave-convex surface including a plurality of protrusions; and forming the electron transport layer on the second concave-convex surface by using a sputtering process or a spin-coating process, so that the surface of the electron transport layer away from the first electrode layer is formed into the first concave-convex surface including a plurality of protrusions.

For example, in the manufacturing method provided by at least one embodiment of the present disclosure, forming a surface of the second electrode sub-layer away from the base substrate into a second concave-convex surface including a plurality of protrusions includes: forming nanoparticles on the surface of the first electrode sub-layer away from the base substrate; forming the second electrode sub-layer with a thickness smaller than that of the nanoparticles on the surface of the first electrode sub-layer away from the base substrate; and removing the nanoparticles by etching the second electrode sub-layer to form the second concave-convex surface including a plurality of protrusions, wherein the thickness of the second electrode sub-layer is 5 nm-10 nm.

For example, in the manufacturing method provided by at least one embodiment of the present disclosure, forming a surface of the second electrode sub-layer away from the base substrate into a second concave-convex surface including a plurality of protrusions includes: forming a conductive film on the surface of the first electrode sub-layer away from the base substrate by adopting an evaporation process, wherein a thickness of the conductive film is 1 nm-5 nm so that the conductive film exposes a part of the first electrode sub-layer, thereby forming the second concave-convex surface including a plurality of protrusions.

For example, in the manufacturing method provided by at least one embodiment of the present disclosure, forming a surface of the second electrode sub-layer away from the base substrate into a second concave-convex surface including a plurality of protrusions includes: forming conductive nanoparticles on the surface of the first electrode sub-layer away from the base substrate to form the second concave-convex surface including a plurality of protrusions, wherein a thickness of the conductive nanoparticle is 1 nm-10 nm.

For example, in the manufacturing method provided by at least one embodiment of the present disclosure, forming the electron transport layer on the second concave-convex surface by using a sputtering process or a spin-coating process includes: forming a doped zinc oxide film doped with magnesium ions and trivalent metal ions on the second concave-convex surface by a sputtering process as the electron transport layer.

For example, in the manufacturing method provided by at least one embodiment of the present disclosure, the trivalent metal ions are aluminum ions, and mass percentages of doped magnesium ions and doped aluminum ions in the doped zinc oxide film are 0.5%-20% and 0.5%-10%, respectively, and the doped zinc oxide film is formed by one selected from the group consisted of ZnMgAlO sputtering, co-sputtering of ZnMgO and $Al_2O_3$, and co-sputtering of ZnAlO and MgO.

At least one embodiment of the present disclosure also provides a manufacturing method of a light-emitting diode device, including: providing a base substrate; forming a first electrode on the base substrate; forming an electron transport layer on a surface of the first electrode away from the base substrate; forming a quantum dot light-emitting layer on a surface of the electron transport layer away from the first electrode layer; and forming a second electrode layer on a surface of the quantum dot light-emitting layer away from the electron transport layer; wherein forming the electron transport layer includes: forming a doped zinc oxide film doped with magnesium ions and trivalent metal ions as the electron transport layer by using a sputtering process.

For example, in the manufacturing method provided by at least one embodiment of the present disclosure, the trivalent metal ions are aluminum ions, and mass percentages of doped magnesium ions and doped aluminum ions in the doped zinc oxide film are 0.5%-20% and 0.5%-10% respectively, and the doped zinc oxide film is formed by one selected from the group consisted of ZnMgAlO sputtering, co-sputtering of ZnMgO and $Al_2O_3$, and co-sputtering of ZnAlO and MgO.

For example, in the manufacturing method provided by at least one embodiment of the present disclosure, roughening the surface of the electron transport layer away from the first electrode layer by a plasma etching process or a sand blasting process, so that a root-mean-square surface roughness of the surface of the electron transport layer away from the first electrode layer ranges from 5 nm to 10 nm.

BRIEF DESCRIPTION OF THE DRAWINGS

In order to clearly illustrate the technical solutions of the embodiments of the present disclosure, the drawings of the embodiments will be briefly described in the following; it is obvious that the described drawings below are only related to some embodiments of the present disclosure without construing any limitation thereto.

DETAILED DESCRIPTION

Figure 1A:
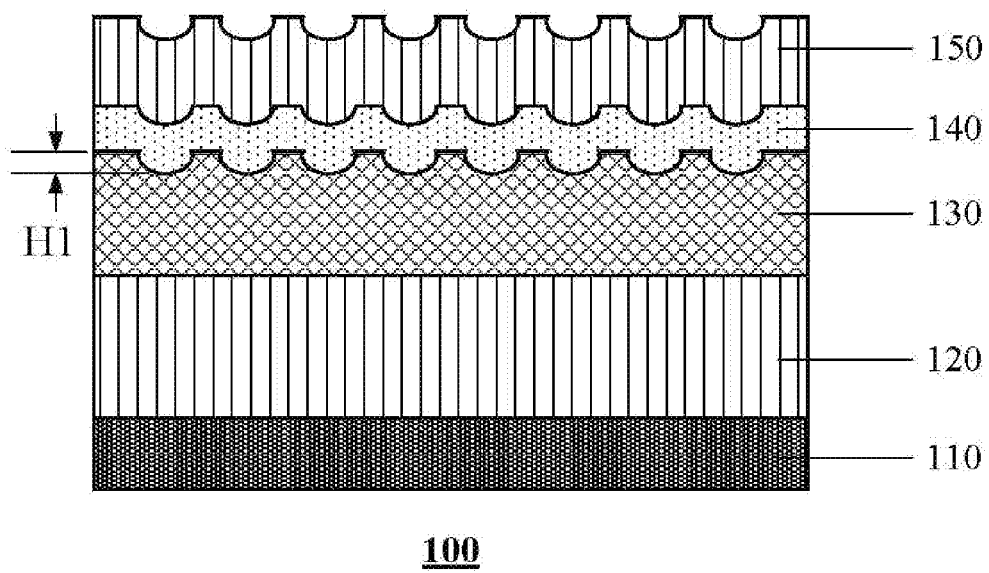
FIG. 1A is a schematic cross-sectional structure diagram of a light-emitting diode device provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

At present, active matrix quantum dot light-emitting diodes (AMQLED) display devices have attracted more and more attentions because of their potential advantages in wide color gamut and long lifetime. Moreover, with the deepening of research on AMQLED display devices, the quantum efficiency of AMQLED display products has been continuously improved, basically reaching the level of industrialization.

In some products, the electron transport layer of the quantum dot light-emitting diode (QLED) can be formed in the following two ways: one is to spin-coat an electron transport material such as zinc oxide nanoparticle to form a spin-coated zinc oxide film as the electron transport layer by using a spin-coating process, and the other is to sputter an electron transport material such as zinc oxide target material to form a sputtered zinc oxide film as the electron transport layer by using a sputtering process. The spin-coated zinc oxide film formed by the spin-coating process usually has impurities (such as organic ligands), and its surface has accumulated zinc oxide nanoparticles and hence is uneven. The sputtered zinc oxide film formed by the sputtering process is an amorphous or polycrystalline film, which has no impurities, so the surface is relatively flat. Therefore, when QLED adopts an inverted structure, if the spin-coated zinc oxide film is used as the electron transport layer, the contact area between the zinc oxide nanoparticles and the cathode is small and the electron injection is less because the zinc oxide nanoparticles are directly spin-coated on the flat cathode; if the sputtered zinc oxide film is used as the electron transport layer, because the sputtered zinc oxide film is relatively flat, the nanoparticle quantum dots in the quantum light-emitting point layer are directly formed on the flat, sputtered zinc oxide film, and the contact area between the quantum dots and the sputtered zinc oxide film is small, resulting in less electron injection; moreover, because the nanoparticle quantum dots are directly formed on the flat, sputtered zinc oxide film, a portion of the sputtered zinc oxide film may directly contact with the subsequent hole transport layer, resulting in electric leakage. At the same time, for the inverted structure, because it is more difficult to inject electrons into the quantum dot light-emitting layer as compared with injecting holes into the quantum dot light-emitting layer, the carriers in the quantum dot light-emitting layer are very unbalanced. Due to the charge accumulation in the quantum dot light-emitting layer caused by carrier imbalance, the phenomena of Auger recombination (it's such a recombination process that, when an electron and a hole are recombined, the energy or momentum is transferred to another electron or another hole by collision, which causes the electron or hole to jump) is serious, and the yield of quantum dots is decreased, thus limiting the further improvement of the light-emitting efficiency and stability of QLED.

In this regard, the embodiments of the present disclosure provide a light-emitting diode device, a manufacturing method thereof, and a display panel. The light-emitting diode device includes a base substrate, a first electrode layer, an electron transport layer and a second electrode layer. The first electrode layer is laminated on the base substrate; the electron transport layer is laminated on a surface of the first electrode layer away from the base substrate; a quantum dot light-emitting layer is laminated on a surface of the electron transport layer away from the first electrode layer; the second electrode layer is laminated on a surface of the quantum dot light-emitting layer away from the electron transport layer; and the surface of the electron transport layer away from the first electrode layer is a first concave-convex surface including a plurality of protrusions.

Therefore, in the light-emitting diode device of the above embodiment, a contact surface between the electron transport layer and the quantum dot light-emitting layer is the first concave-convex surface including a plurality of protrusions, so that the contact area between the electron transport layer and the quantum dot light-emitting layer can be increased, thereby alleviating the problem of carrier imbalance in the quantum dot light-emitting layer caused by less electron injection, and also alleviating the problem of Auger recombination of excitons in the quantum dot light-emitting layer.

In addition, due to the characteristics of quantum dot material per se, QLED is generally prepared by printing technology or printing method, which can improve the material utilization rate and has become an effective way for large-area manufacture. When QLED adopts an upright structure, the hole injection layer and the hole transport layer below the quantum dot light-emitting layer are uneven, so the degree of unevenness is accumulated layer by layer from the hole injection layer to the quantum dot light-emitting layer, which seriously affects the uniformity of the quantum dot light-emitting layer and the QLED finally formed. When QLED adopts the inverted structure, because the quantum dot light-emitting layer is below the hole injection layer and the hole transport layer, the degree of unevenness of the quantum dot light-emitting layer is relieved compared with the case of upright structure. However, when the sputtered zinc oxide film formed by using the sputtering process is used as the electron transport layer, it is difficult for electrons to be injected into the quantum dot light-emitting layer from the sputtered zinc oxide film because of the higher mobility and deeper energy level of the sputtered zinc oxide film as compared with the quantum dot light-emitting layer, thus affecting the quantum dot luminescent efficiency. For example, the LUMO energy level of common zinc oxide nanoparticles is about −4.2 eV to −4.0 eV, while the LUMO energy level of sputtered zinc oxide films is about −4.8 eV to −4.6 eV. It can be seen that the LUMO energy level of sputtered zinc oxide film is deeper, which is quite different from that of quantum dot light-emitting layer.

In this regard, another embodiment of the present disclosure also provides a manufacturing method of a light-emitting diode device. The manufacturing method includes: providing a base substrate; forming a first electrode on the base substrate; forming an electron transport layer on a surface of the first electrode away from the base substrate; forming a quantum dot light-emitting layer on a surface of the electron transport layer away from the first electrode layer; and forming a second electrode layer on a surface of the quantum dot light-emitting layer away from the electron transport layer. Forming the electron transport layer includes: forming a doped zinc oxide film doped with magnesium ions and trivalent metal ions by using a sputtering process, as the electron transport layer.

Therefore, in the manufacturing method of the light-emitting diode device of the above embodiment, the doped zinc oxide film doped with magnesium ions and trivalent metal ions is used as the electron transport layer, so that the electron transport layer can have more matching energy levels, more appropriate conductivity and better stability with respect to the quantum dot light-emitting layer.

Hereinafter, a light-emitting diode device and a manufacturing method thereof, a display panel and a manufacturing method of another light-emitting diode device provided by the embodiments of the present disclosure will be described in detail with reference to the drawings.

At least one embodiment of the present disclosure provides a light-emitting diode device. FIG. 1A is a schematic diagram of a cross-sectional structure of a light-emitting diode device according to an embodiment of the present disclosure. As shown in FIG. 1A, the light-emitting diode device 100 includes a base substrate 110, a first electrode layer 120, an electron transport layer 130, a quantum dot light-emitting layer 140, and a second electrode layer 150. The first electrode layer 120 is laminated on the base substrate 110; the electron transport layer 130 is laminated on a surface of the first electrode layer 120 away from the base substrate; the quantum dot light-emitting layer 140 is laminated on a surface of the electron transport layer 130 away from the first electrode layer; and the second electrode layer 150 is laminated on a surface of the quantum dot light-emitting layer 140 away from the electron transport layer 130. The surface of the electron transport layer 130 away from the first electrode layer 120 is a first concave-convex surface including a plurality of protrusions.

For example, in some examples, the first concave-convex surface (i.e., the surface where the electron transport layer 130 is in contact with the quantum dot light-emitting layer 120) includes a plurality of protrusions so that the root-mean-square surface roughness (RMS) of the first concave-convex surface ranges from about 5 nm to 10 nm. It should be noted that, "about 5 nm to 10 nm" here means that the lower limit of the range of root-mean-square surface roughness is within an error range of 10% of 5 nm, and the upper limit of the range of root-mean-square surface roughness is within an error range of 10% of 10 nm.

Therefore, the contact surface between the electron transport layer 130 and the quantum dot light-emitting layer 140 has high roughness, and the contact area between the electron transport layer and the quantum dot light-emitting layer is large, so that when the electron transport layer 130 adopts the sputtered zinc oxide film formed by the sputtering process, problems such as less electron injection, unbalanced carriers and the like caused by the accumulation of nanoparticle quantum dots on the flat surface of the sputtered zinc oxide film can be avoided.

For example, in some examples, as shown in FIG. 1A, the height H1 of the plurality of protrusions included in the first concave-convex surface in the direction perpendicular to the base substrate 110 ranges from 1 nm to 10 nm, such as 3 nm, 5 nm, 8 nm, etc. Note that the height H1 refers to the distance between the peaks and valleys of these protrusions in the direction perpendicular to the base substrate 110.

In addition, the shapes of the plurality of protrusions included in the first concave-convex surface can be varied. Although the shape of the protrusion is shown as a protrusion with a plurality of arc-shaped notches arranged in an array in FIG. 1A, the embodiment of the present disclosure is not limited to this. In other embodiments, the shape of the protrusion may include column-shaped protrusion, spherical-shaped protrusion, island-shaped protrusion, arc-shaped protrusion, wave-shaped protrusion, etc., which may be regular or irregular. The shape of the protrusion is related to the specific process of preparing the first concave-convex surface.

In addition, the distribution of the plurality of protrusions included in the first concave-convex surface may be uniform or non-uniform. When the protrusions are uniformly distributed, the distribution spacing between adjacent protrusions can be, for example, 5 nm to 10 nm, such as 6 nm, 8 nm, etc. Although the projections as shown are uniformly distributed in FIG. 1A, the embodiments of the present disclosure are not limited thereto. Whether the protrusions are uniformly distributed is related to the specific process of preparing the first concave-convex surface.

In addition, the light-emitting diode device provided by the present embodiment may further include a hole transport layer and a hole injection layer (not shown in the figure). In such case, the hole transport layer and the hole injection layer are sequentially laminated on the quantum dot light-emitting layer 140, and the second electrode layer 150 is laminated on the hole injection layer.

For example, the first electrode 110 is a cathode. In this case, the material of the first electrode 110 may be a material with low work function, such as magnesium (Mg), calcium (Ca), indium (In), lithium (Li), aluminum (Al), silver (Ag) or their alloy or fluoride, such as magnesium (Mg)-silver (Ag) alloy, lithium (Li)-fluoride, lithium (Li)-oxygen (O) compound, which is not limited by the embodiments of the present disclosure.

For example, the quantum dot light-emitting layer 140 includes silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots, etc., and the quantum dots can be spherical or quasi-spherical, with a particle size of 2 nm-20 nm, which is not limited by the embodiments of the present disclosure.

For example, the material of the hole injection layer may include star-shaped triphenylamine compound, metal complex, polyaniline, fluorocarbon, Porphyrin derivative, P-Doped amine derivative, poly (3,4-ethylenedioxythiophene)-polystyrene sulfonic acid (PEDOT/PSS), polythiophene or polyaniline, which is not limited by the embodiments of the present disclosure.

For example, the second electrode 150 is an anode. In this case, the material of the second electrode 150 may be metal, alloy, or the combination of metal, alloy and metal oxide with good conductivity. Examples include Ag, Au, Pd, Pt, Ag:Au (i.e. the alloy of Ag and Au), Ag:Pd, Ag:Pt, Al:Au, Al:Pd, Al:Pt, Ag:Au, Ag/Pd (i.e. the lamination of Ag and Pd), Ag/Pt, Ag/ITO, Ag/IZO, Al/Au, Al/Pd, Al/Pt, Al/ITO, Al/IZO, Ag:Pd/ITO, Ag:Pt/ITO, Al:Au/ITO, Al:Pd/ITO, Al:Pt/ITO, Ag:Au/ITO, Ag:Pd/IZO, Ag:Pt/IZO, Al:Au/IZO, Al:Pd/IZO, Al:Pt/IZO, Ag:Au/IZO and the like, which is not limited by the embodiments of the present disclosure.

Figure 1B:
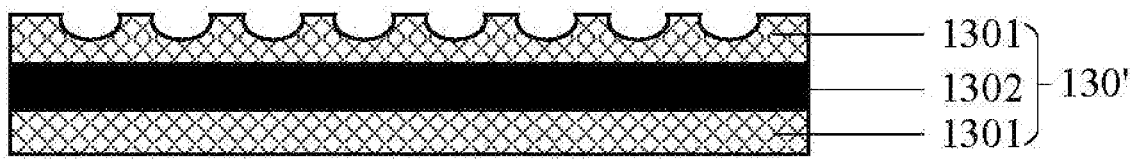
FIG. 1B is a schematic cross-sectional structure diagram of an electron transport layer of a light-emitting diode device provided by at least one embodiment of the present disclosure.

For example, in some examples, as shown in FIG. 1B, the electron transport layer 130' may include N+1 electron transport sub-layers 1301 and N electron blocking sub-layers 1302 (two electron transport sub-layers 1301 and one electron blocking sub-layer 1302 are shown in FIG. 1B by way of example), and the N electron blocking sub-layers 1302 are sandwiched between the N+1 electron transport sub-layers 1301, respectively, where N is a positive integer greater than or equal to 2. The surface of the electron transport sub-layer among the N+1 electron transport sub-layers 1301 farthest from the base substrate 110, which is away from the base substrate 110, serves as the first concave-convex surface including a plurality of protrusions, the materials of the N+1 electron transport sub-layers are the same, and the materials of the N+1 electron blocking sub-layers are different from that of the N+1 electron transport sub-layers.

Therefore, by additionally providing the electron blocking sub-layer in the electron transport layer, the electrons injected into the electron transport layer from the first electrode can be reduced when the electron transport layer has high mobility, so that the carrier concentration in the quantum dot light-emitting layer can be balanced and the luminous efficiency of QLED can be improved. In addition, when the electron blocking layer is arranged in the electron transport layer, the lighting voltage can be effectively reduced.

For example, the electron transport layer 130 in FIG. 1A can be replaced by the electron transport layer 130' shown in FIG. 1B. The electron transport layer 130 includes two electron transport sub-layers 1301 and one electron blocking sub-layer 1302, and the electron blocking sub-layer 1302 is sandwiched between the two electron transport sub-layers 1301. Among the two electron transport sub-layers 1301, a surface of the electron transport sub-layer farthest from the base substrate 110 that is in contact with the quantum dot transport layer 140 is a first concave-convex surface including a plurality of protrusions.

For example, the materials of the two electron transport sub-layers 1301 are the same, for example, at least one of ZnO, ZnMgO, ZnAlO and ZnMgAlO. The material of the electron blocking sub-layer 1302 is different from that of the electron transport sub-layer 1301. For example, the material of the electron blocking sub-layer 1302 includes at least one of aluminum oxide ($Al_2O_3$), tantalum oxide (TaOx) and hafnium oxide ($HfO_2$). Of course, other suitable materials can be used for the electron blocking sub-layer 1302, which is not limited by the embodiments of the present disclosure.

Note that when N>1, there is more than one electron blocking sub-layer 1302, and the materials of the electron blocking sub-layers 1302 may be the same or different. For example, when there are two electron blocking sub-layers 1302, the material of one electron blocking sub-layer 1302 may be aluminum oxide, and the material of the other electron blocking sub-layer may be tantalum oxide. When the N electron blocking sub-layers are made of the same material, the complexity of the preparation process can be reduced, and it is easy to control and realize.

For example, in some examples, in order to improve the energy level matching between the electron transport layer and the quantum dot light-emitting layer and their mobility, the electron transport layer 130 (or the electron transport sub-layer 1301) may use a doped zinc oxide film doped with magnesium ions and trivalent metal ions.

For example, in some examples, the trivalent metal ion is aluminum ion, and the mass percentage of doped magnesium ion in the doped zinc oxide film is 0.5% to 20%, such as 5%, 10% or 15%, and the mass percentage of doped aluminum ion is 0.5% to 10%, such as 2%, 5% or 7%.

Figure 2A:
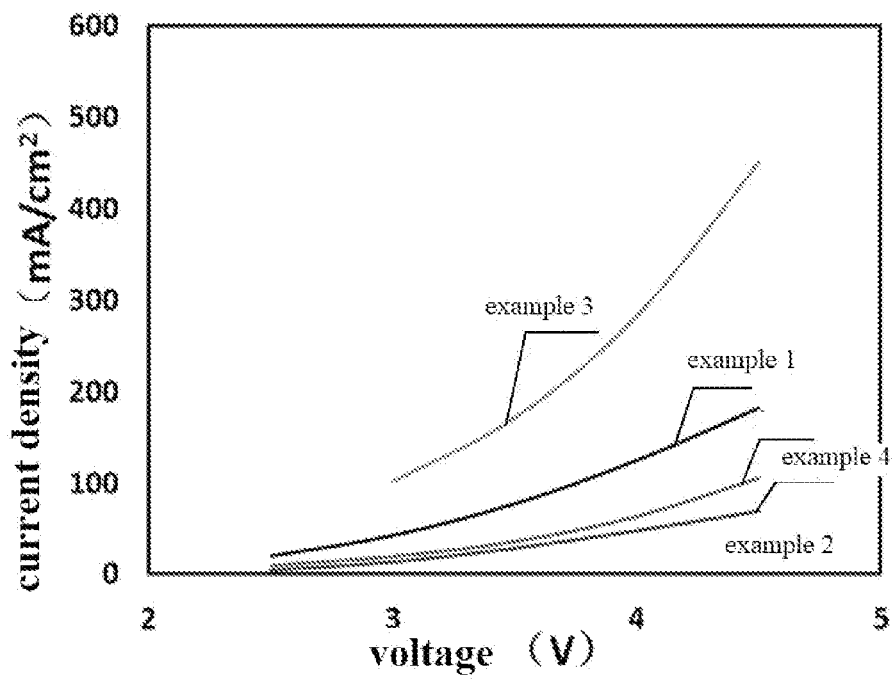
FIGS. 2A and 2B are comparative diagrams respectively illustrating current density and current efficiency of a light-emitting diode device provided by at least one embodiment of the present disclosure that are changed with voltage under different electron transport layer materials.
Figure 2B:
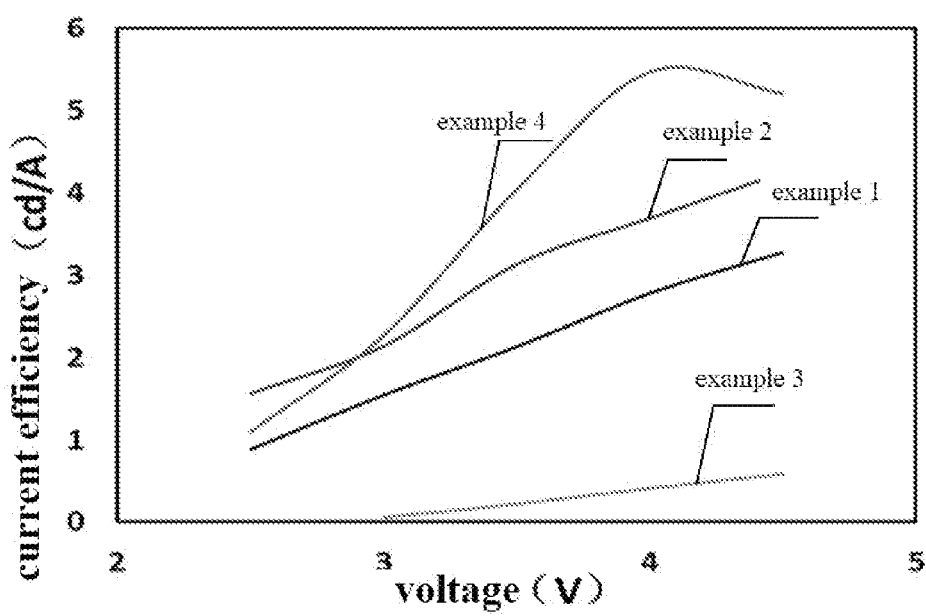

FIGS. 2A and 2B are comparative diagrams respectively illustrating current density and current efficiency of a light-emitting diode device provided by at least one embodiment of the present disclosure that are changed with voltage under different electron transport layer materials. FIG. 2A shows the current density of the light-emitting diode device that is changed with the voltage when the materials of electron transport layers are ZnO film, ZnMgO film, ZnAlO film and ZnMgAlO film, respectively. FIG. 2B shows the current efficiency of the light-emitting diode device that is changed with the voltage when the materials of electron transport layers are ZnO film, ZnMgO film, ZnAlO film and ZnMgAlO film, respectively.

In FIGS. 2A and 2B, the light-emitting diode device provided by Example 1 includes a silver (Ag) electrode (as a cathode), an electron transport layer (ET), a quantum dot light-emitting layer (QD), a hole transport layer (HT), a hole injection layer (HI), and an ITO electrode (as an anode) which are sequentially laminated. The thickness of the ITO electrode is about 70 nm. The ITO electrode can be prepared by a sputtering process, in which the ITO target material can be used, the flow rate of argon is about 40 sccm, the power is about 100 W, and the sputtering time is about 20 minutes. The electron transport layer adopts zinc oxide film (ZnO film) which is not doped with any elements and has a thickness of about 100 nanometers; the ZnO film is prepared by a sputtering process, in which the ZnO target material can be used, the flow rate of argon is about 40 sccm, the power is about 100 W, and the sputtering time is about 25 minutes. The material of the quantum dot light-emitting layer is cadmium selenide (CdSe), the thickness of the quantum dot light-emitting layer is about 30 nanometers, and the quantum dot light-emitting layer is prepared by a spin-coating process. The hole transport layer includes a first hole transport sub-layer and a second hole transport sub-layer, wherein the first hole transport sub-layer is located at one side of the second hole transport sub-layer close to the quantum dot light-emitting layer, and the thickness of the first hole transport sub-layer is about 10 nanometers, and the thickness of the second hole transport sub-layer is about 30 nanometers. The thickness of the hole injection layer is about 5 nm, and the material of the hole injection layer is HAT-CN(2,3,6,7,10,11-hexacyano-1,4,5,8,9,12-hexaazaphenanthrene) film. The thickness of the silver electrode is about 150 nm. The silver electrode, the hole injection layer and the hole transport layer mentioned above all can be prepared by an evaporation process.

In FIGS. 2A and 2B, the light-emitting diode device provided by Example 2 is different from Example 1 in that, the electron transport layer adopts a doped zinc oxide film (ZnMgO film) doped with magnesium, and the mass fraction of magnesium in the ZnMgO film is about 2%, and the film thickness is about 100 nm. The ZnMgO film can be prepared by a sputtering process using ZnO:MgO target material, or by a co-sputtering process using ZnO target material and MgO target material, the flow rate of argon is 40 sccm, the power is 100 W and the sputtering time is 25 minutes.

In FIG. 2A and FIG. 2B, the light-emitting diode device provided by Example 3 is different from Example 1 in that, the electron transport layer adopts a doped zinc oxide film (ZnAlO film) doped with aluminum, the mass fraction of Al in the ZnAlO film is about 2%, and the film thickness is about 100 nm. The ZnAlO film can be prepared by a sputtering process using ZnO:Al$_2$O$_3$ target material, or by a co-sputtering process using ZnO target material and Al$_2$O$_3$ target material, and the flow rate of argon is 40 sccm, the power is 100 W and the sputtering time is 25 min.

In FIGS. 2A and 2B, the light-emitting diode device provided by Example 4 is different from Example 1 in that, the electron transport layer adopts a doped zinc oxide film (ZnMgAlO film) doped with magnesium and aluminum, the mass fraction of Mg in the ZnMgAlO film is about 2%, the mass fraction of Al is about 2%, and the thickness of the ZnMgAlO film is about 100 nm. The ZnMgAlO film is prepared by a sputtering process using ZnMgAl target material, or by a co-sputtering process using ZnMgO target material and Al$_2$O$_3$ target material, the flow rate of argon is 40 sccm, the power is 100 W and the sputtering time is 25 min.

Referring to FIGS. 2A and 2B, under the same voltage, compared with the light-emitting diode device provided by Example 1 which uses a ZnO film without doping any element as the electron transport layer, the current density of the light-emitting diode device provided by Example 2 is decreased by using ZnMgO film doped with magnesium element as the electron transport layer, resulting in that the conductivity is decreased, the current efficiency is increased, and the luminous efficiency is improved; the current density of the light-emitting diode device provided by Example 3 is greatly increased by using ZnAlO film doped with aluminum element as the electron transport layer, resulting in that the conductivity is greatly increased, the current efficiency is greatly reduced, and hence the luminous efficiency is greatly reduced; the current density of the light-emitting diode device provided by Example 4 is decreased but is higher than that provided by Example 2, by using ZnMgAlO film doped with magnesium element and aluminum element as the electron transport layer, resulting in that the conductivity is moderate, the current efficiency is higher than that of the light-emitting diode devices provided by Examples 1 to 3, and hence the luminous efficiency is the highest.

Therefore, by using the doped zinc oxide film doped with magnesium ions and aluminum ions, it can not only adjust the energy level of the electron transport layer to a level matched with the quantum dot light-emitting layer, but also provide moderate conductivity and better luminescent efficiency.

It should be noted that, the mass fraction of aluminum element and magnesium element in the above examples 2 to 4 is about 2%, which merely is a value set for comparison experiments. In fact, through many experiments conducted by the inventor(s), the above-described effects can be obtained when the mass percentage of doped magnesium ions is in the range of 0.5% to 20% and the mass percentage of doped aluminum ions is in the range of 0.5% to 10%.

In addition, the aluminum ions in the above examples 2 to 4 can also be replaced by other trivalent metal ions (for example, indium (In) ions and Gallium (Ga) ions), which will not be described in details in the embodiments of the present disclosure for simplicity.

Figure 3A:
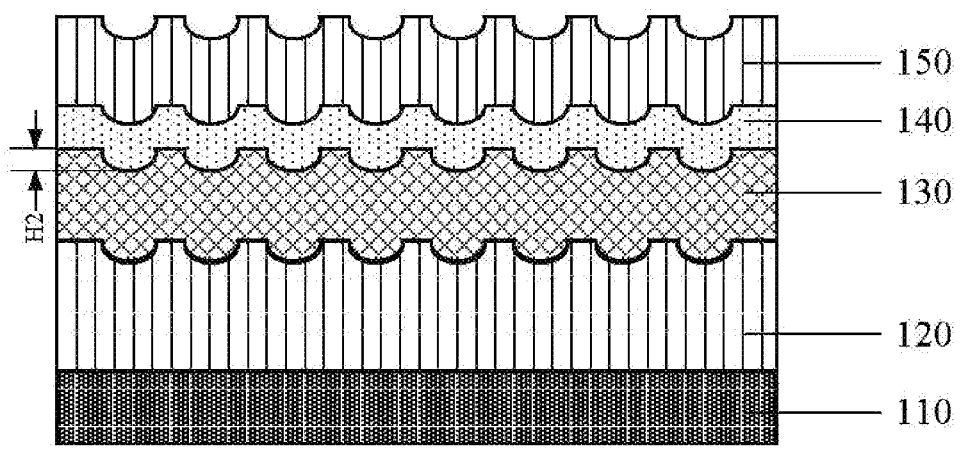
FIG. 3A is a schematic cross-sectional structure diagram of another light-emitting diode device provided by at least one embodiment of the present disclosure.

FIG. 3A is a schematic cross-sectional structure diagram of a light-emitting diode device according to another embodiment of the present disclosure. As shown in FIG. 3A, what is different from the structure shown in FIG. 1A is that, in the light-emitting diode device provided in the present embodiment, not only the surface of the electron transport layer 130 in contact with the quantum dot light-emitting layer 140 is a first concave-convex surface including a plurality of protrusions, but also the surface of the first electrode layer 120 away from the base substrate 110 is a second concave-convex surface including a plurality of protrusions.

For example, in some examples, the second concave-convex surface (i.e., the surface where the first electrode 120 is in contact with the electron transport layer 130) includes a plurality of protrusions such that the root-mean-square surface roughness (RMS) of the second concave-convex surface ranges from about 5 nm to 10 nm. It should be noted that "about 5 nm-10 nm" here means that the lower limit of the range of root-mean-square surface roughness is within an error range of 10% of 5 nm, and the upper limit of the range of root-mean-square surface roughness is within an error range of 10% of 10 nm.

Therefore, the contact area between the first electrode layer 120 and the electron transport layer 130 can be increased by providing a plurality of protrusions on the surface of the first electrode layer 120 in contact with the electron transport layer 130, so that when the spin-coated zinc oxide film formed by the spin-coating process is used as the electron transport layer 130, the problems such as small contact area caused by the accumulation of zinc oxide nanoparticles spin-coated on the flat, first electrode layer 120, less electron injection, and unbalanced carriers can be avoided.

For example, in some examples, the height H2 of the plurality of protrusions included in the second concave-convex surface in the direction perpendicular to the base substrate 110 ranges from 1 nm to 10 nm, such as 2 nm, 5 nm or 7 nm. Note that the height H2 refers to the distance between the peaks and valleys of these protrusions in the direction perpendicular to the base substrate 110.

Figure 9A:
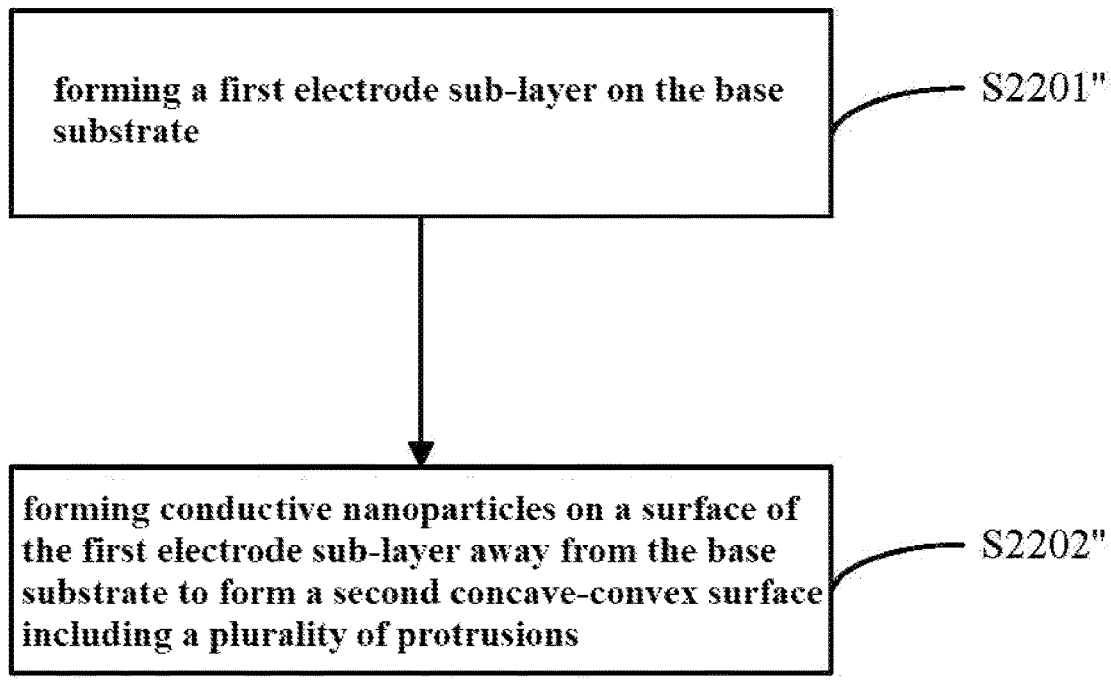
FIG. 9A is a flowchart of another method of forming the surface of the second electrode sub-layer away from the base substrate into the second concave-convex surface including a plurality of protrusions in FIG. 6.
Figure 9B:
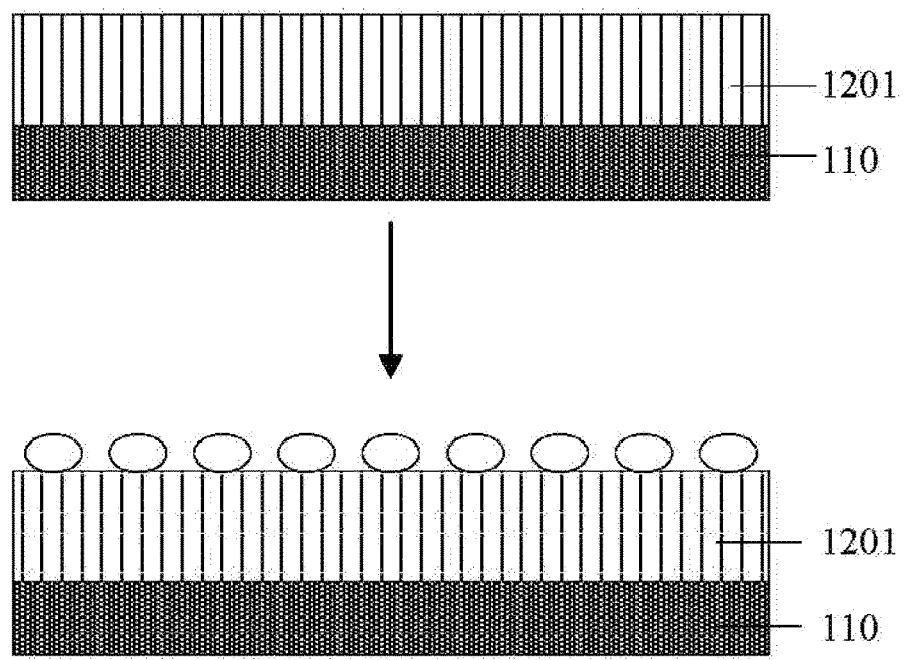
FIG. 9B shows schematic structure diagrams of forming the light-emitting diode device in one-to-one correspondence with the steps of the method in FIG. 9A.

For example, in some examples, the first electrode layer 120 includes a first electrode sub-layer and conductive nanoparticles disposed on the first electrode sub-layer (for example, the first electrode sub-layer 1201 and the conductive nanoparticles thereon, as shown in FIG. 9B), that is, these conductive nanoparticles constitute the plurality of protrusions of the second concave-convex surface.

In addition, similar to the first concave-convex surface, the shapes of the protrusions included in the second concave-convex surface can be varied. The distribution of the plurality of protrusions included in the second concave-convex surface may be uniform or non-uniform. When these protrusions are uniformly distributed, the distribution spacing between adjacent protrusions may be, for example, 5 nm to 10 nm. To avoid repetition, it will not be repeated here.

In some examples, the plurality of protrusions included in the second concave-convex surface (i.e., the surface where the first electrode layer 120 in contact with the electron transport layer 130) have the same shape as those included in the first concave-convex surface (i.e., the surface where the electron transport layer 130 in contact with the quantum dot light-emitting layer 140), and the protrusions included in the second concave-convex surface have the same height as those included in the first concave-convex surface in the direction perpendicular to the base substrate 110. For example, in the manufacturing process, the surface of the first electrode 120 in contact with the electron transport layer 130 is firstly manufactured into a second concave-convex surface including a plurality of protrusions, and then the electron transport layer 130 is formed on the second concave-convex surface with equal thickness, so that the electron transport layer 130 is naturally formed into a first concave-convex surface including a plurality of protrusions. In such case, the electron transport layer 130 with a first concave-convex surface including a plurality of protrusions can be formed with equal thickness regardless of using a spin-coating process or a sputtering process.

In addition, the light-emitting diode device provided by at least one embodiment of the present disclosure may further include a hole transport layer and a hole injection layer (not shown). At this time, the hole transport layer and the hole injection layer are sequentially laminated on the quantum dot light-emitting layer 140, and the second electrode 150 is laminated on the hole injection layer. The materials of the hole transport layer and the hole injection layer are the same as those previously described in connection with FIG. 1A, which will not be repeated here.

Figure 3B:
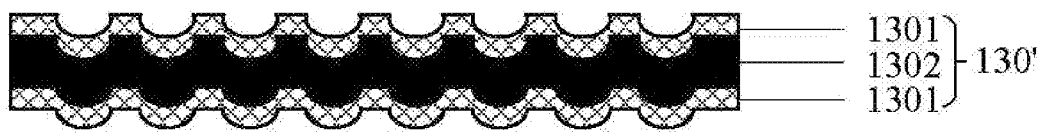
FIG. 3B is a schematic cross-sectional structure of an electron transport layer of another light-emitting diode device provided by at least one embodiment of the present disclosure.

In addition, similar to FIG. 1A, the electron transport layer 130 in FIG. 3A can be replaced by the electron transport layer 130' shown in FIG. 3B. The electron transport layer 130' includes two electron transport sub-layers 1301 and one electron blocking sub-layer 1302 sandwiched between the two electron transport sub-layers 1301. Among the two electron transport sub-layers 1301, the surface of the electron transport sub-layer farthest from the base substrate 110 that is in contact with the quantum dot transport layer 140 is a first concave-convex surface including a plurality of protrusions. The materials of the electron transport sub-layer 1301 and the electron blocking sub-layer 1302 are similar to those previously described in connection with FIG. 1A, and will not be repeated here.

In addition, similar to FIG. 1A, the electron transport layer 130 (or the electron transport sub-layer 1301) shown in FIG. 3A can also use a doped zinc oxide film doped with magnesium ions and trivalent metal ions. The trivalent metal ion can be aluminum ion, and the mass percentage of the doped magnesium ion in the doped zinc oxide film is 0.5%-20%, such as 5%, 10% or 15%, and the mass percentage of the doped aluminum ion is 0.5%-10%, such as 2%, 5% or 7%, which will not be repeated here.

Figure 4:
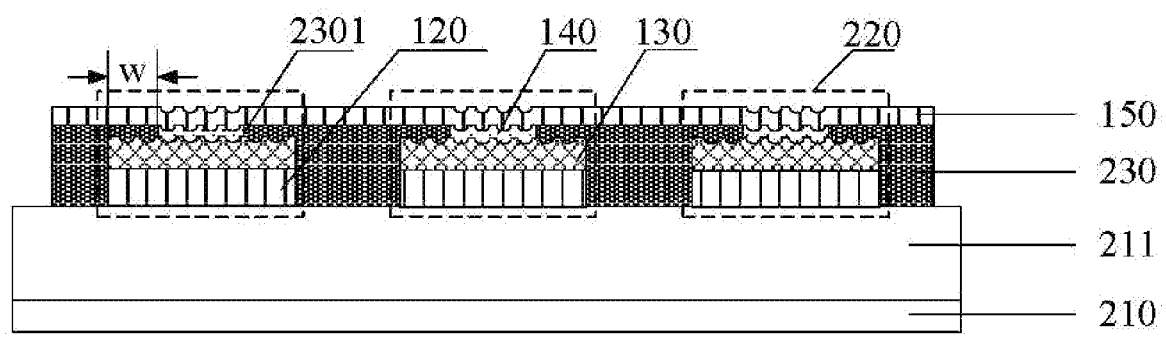
FIG. 4 is a schematic cross-sectional view of a display panel provided by at least one embodiment of the present disclosure.

FIG. 4 is a schematic cross-sectional view of a display panel according to at least one embodiment of the present disclosure. As shown in FIG. 4, the display panel 200 includes a base substrate 210 and a plurality of sub-pixels 220 arranged in an array on the base substrate 210, and each of the plurality of sub-pixels 220 includes the above-mentioned light-emitting diode device 100.

For example, the display panel 200 further includes a pixel defining layer 230, which is disposed on the surface of the electron transport layer 130 away from the base substrate 200. The pixel defining layer 230 includes a plurality of openings 2301, the pixel defining layer 230 at least partially covers the edge of the electron transport layer 130, and the plurality of openings 2301 respectively expose the middle part of the electron transport layer 130. The quantum dot light-emitting layer 140 is disposed at least in the plurality of openings.

For example, the display panel 200 further includes a pixel circuit layer 211, which is disposed between the base substrate 210 and the light-emitting diode device 100. Each sub-pixel 220 further includes a pixel driving circuit provided in the pixel circuit layer 211 for driving the light-emitting state of the light-emitting diode device 100.

For example, as shown in FIG. 4, after the electron transport layer 130 is formed on the first electrode layer 120, and before the quantum dot light-emitting layer 140 is formed on the surface of the electron transport layer 130 away from the first electrode layer 120, the pixel defining layer 220 is formed on the surface of the electron transport layer 130 away from the first electrode layer 120, so that the range of the subsequent manufacture of the quantum dot light-emitting layer 140 can be better defined. Furthermore, the pixel defining layer 220 can not only provide openings for forming the quantum dot light-emitting layer 140, but also shield the defects (e.g., burrs) at the edge of the already formed electron transport layer 130, so that the uniformity of the subsequently formed film layer(s) is improved. The width W of the overlapped part of the orthographic projection of the pixel defining layer 220 on the base substrate 210 and the orthographic projection of the electron transport layer 120 of each light-emitting element 210 on the base substrate 110 may be in the range of 1 micron to 5 microns, such as 2 microns or 3 microns.

For example, the base substrate 210 may be a rigid substrate or a flexible substrate. The rigid substrate may be a glass substrate, a ceramic substrate, a plastic substrate, etc., and the flexible substrate may be a plastic substrate (such as a polyimide substrate), a resin substrate, etc., which is not limited by the embodiments of the present disclosure.

The display panel has all the features and advantages of the aforementioned QLED device, and will not be described in detail here.

The embodiment of the present disclosure also provides a display device. The display device includes the display panel 200 as described above. As those skilled in the art will understand, the display device 200 may also include necessary packaging elements and control circuits, which are not limited by the embodiments of the present disclosure. The display device can be realized as any product or component with display function, such as mobile phone, tablet computer, television, monitor, notebook computer, digital photo frame, navigator, etc.

The display device has all the features and advantages of the aforementioned QLED device, and will not be described in detail here.

Figure 5:
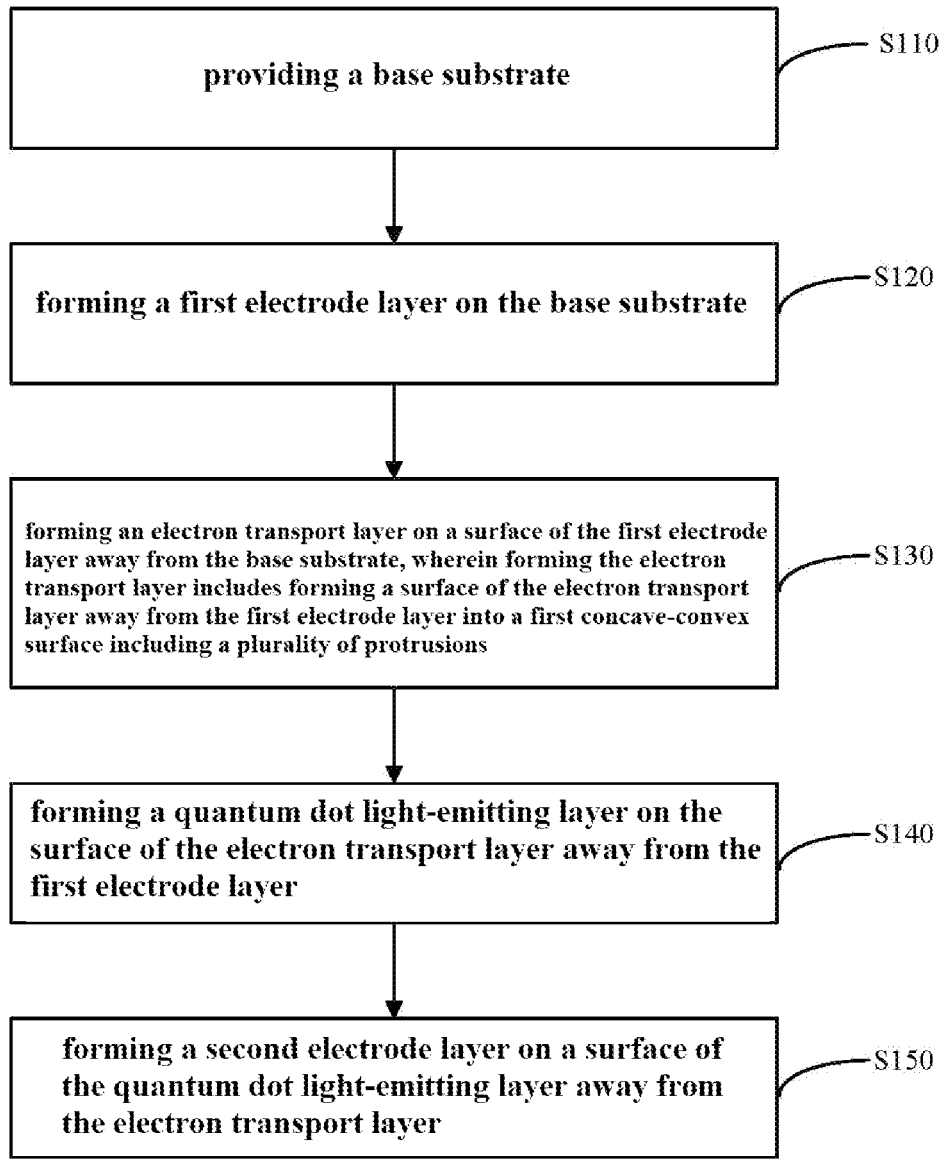
FIG. 5 is a flowchart of a manufacturing method of a light-emitting diode device provided by at least one embodiment of the present disclosure.

FIG. 5 is a flowchart of a manufacturing method of a light-emitting diode device according to at least one embodiment of the present disclosure. Referring to FIG. 5, the manufacturing method includes step S110-step S150.

S110: providing a base substrate.

For example, the base substrate may be a glass substrate, a quartz substrate, a flexible PET (polyethylene terephthalate) substrate, etc., and the specific form of the base substrate is not limited by the embodiments of the present disclosure.

S120: forming a first electrode layer on the base substrate.

For example, the first electrode layer can be a transparent electrode made of ITO (indium tin oxide), FTO (fluorine doped tin oxide) or conductive polymer, or it can be an opaque electrode, such as a metal electrode, for example, an aluminum or silver electrode.

S130: forming an electron transport layer on a surface of the first electrode layer away from the base substrate, wherein forming the electron transport layer includes forming a surface of the electron transport layer away from the first electrode layer into a first concave-convex surface including a plurality of protrusions.

S140: forming a quantum dot light-emitting layer on the surface of the electron transport layer away from the first electrode layer.

For example, the quantum dot light-emitting layer can adopt quantum dot materials such as silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots and indium arsenide quantum dots.

S150, forming a second electrode layer on a surface of the quantum dot light-emitting layer away from the electron transport layer.

For example, the second electrode layer may be of metal, alloy, or a combination of metal, alloy and metal oxide with good conductive function.

The light-emitting diode device manufactured by the method can have the structure shown in FIG. 1A.

In this way, the contact surface between the electron transport layer and the quantum dot light-emitting layer is formed as a first concave-convex surface including a plurality of protrusions, and the contact area between the electron transport layer and the quantum dot light-emitting layer is large, so that when the electron transport layer adopts a sputtered zinc oxide film formed by a sputtering process, the problems of less electron injection, unbalanced carriers and the like caused by the accumulation of nanoparticle quantum dots on the flat surface of the sputtered zinc oxide film can be avoided.

For example, the step S130 of forming the surface of the electron transport layer away from the first electrode layer into a first concave-convex surface including a plurality of protrusions can be realized in various ways. For example, the surface of the electron transport layer away from the first electrode layer can be roughened by a plasma etching process or a sand blasting process; for example, the RMS surface roughness of the surface of the electron transport layer away from the first electrode layer ranges from 5 nm to 10 nm. The plasma etching process may be a dry etching process, such as Reactive Ion Etching (RIE) and Inductively Coupled Plasma (ICP) etching process, and argon or oxygen plasma is used as the reaction gas for etching. The sand blasting process can be performed by using ceramic sands, quartz sands and other materials.

Figure 6:
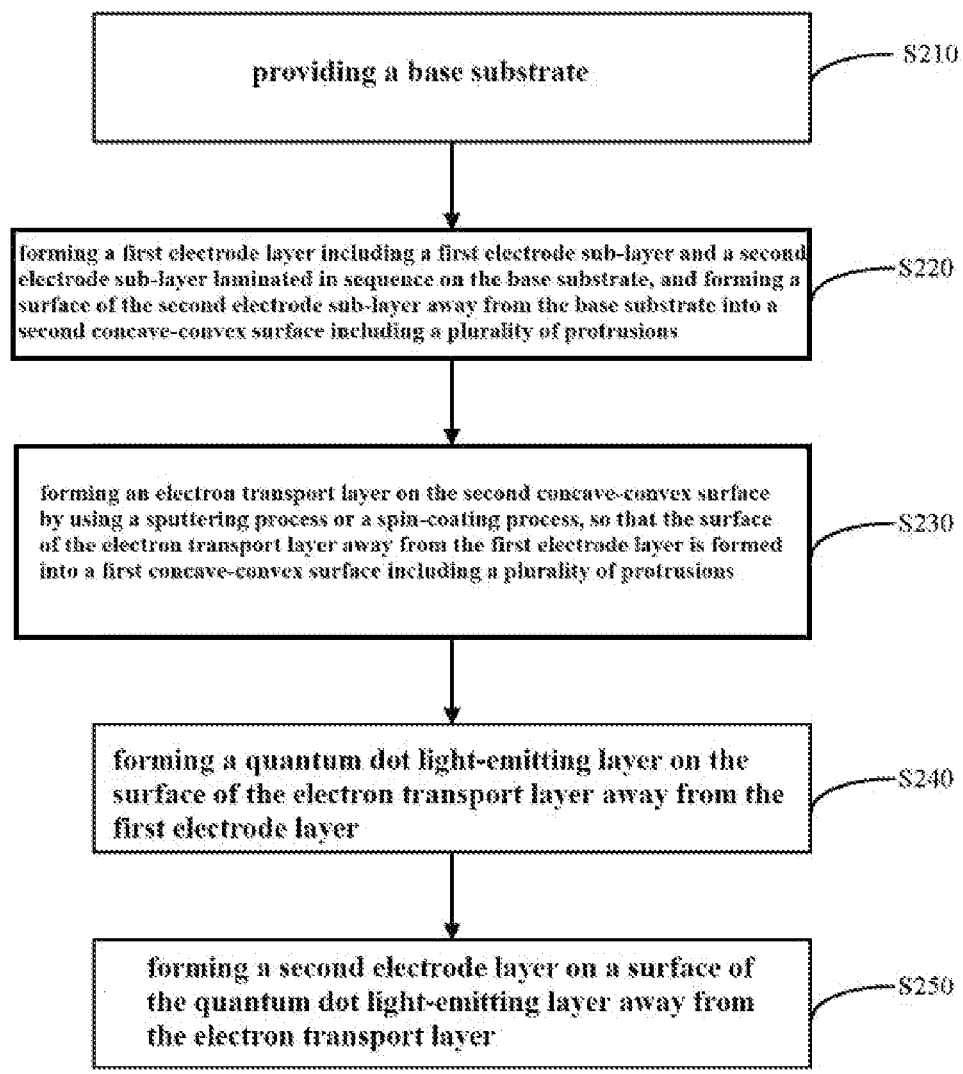
FIG. 6 is a flowchart of another manufacturing method of a light-emitting diode device provided by at least one embodiment of the present disclosure.

For example, FIG. 6 is a flowchart of a manufacturing method of a light-emitting diode device according to another embodiment of the present disclosure. What is different from FIG. 5 is that, in this manufacturing method, the surface of the first electrode layer in contact with the electron transport layer is firstly manufactured into a second concave-convex surface including a plurality of protrusions, and then an electron transport layer is formed on the second concave-convex surface, so that the electron transport layer is formed into a first concave-convex surface including a plurality of protrusions.

Specifically, as shown in FIG. 6, steps S210, S240 and S250 in this manufacturing method are the same as steps S110, S140, and S150 in FIG. 5. In addition, in step S220, a first electrode layer including a first electrode sub-layer and a second electrode sub-layer laminated in sequence is formed on a base substrate, and a surface of the second electrode sub-layer away from the base substrate is formed into a second concave-convex surface including a plurality of protrusions; in step S230, an electron transport layer is formed on the second concave-convex surface by using a sputtering process or a spin-coating process, so that the surface of the electron transport layer away from the first electrode layer is formed into a first concave-convex surface including a plurality of protrusions. The sputtering or spin-coating process can be carried out with equal thickness or unequal thickness. In the case of sputtering or spin-coating process with equal thickness, the plurality of protrusions included in the first concave-convex surface formed later will have the same shape and size (for example, the same shape and height) as those included in the second concave-convex surface. The light-emitting diode device manufactured by this method may have a structure as shown in FIG. 3A, in which the first electrode layer 120 includes a first electrode sub-layer 1201 and a second electrode sub-layer 1202 (as shown in FIG. 7B).

The step S220 of forming the surface of the second electrode sub-layer away from the base substrate into a second concave-convex surface including a plurality of protrusions can be realized in various ways, which will be described below with reference to FIGS. 7A-9B.

Figure 7A:
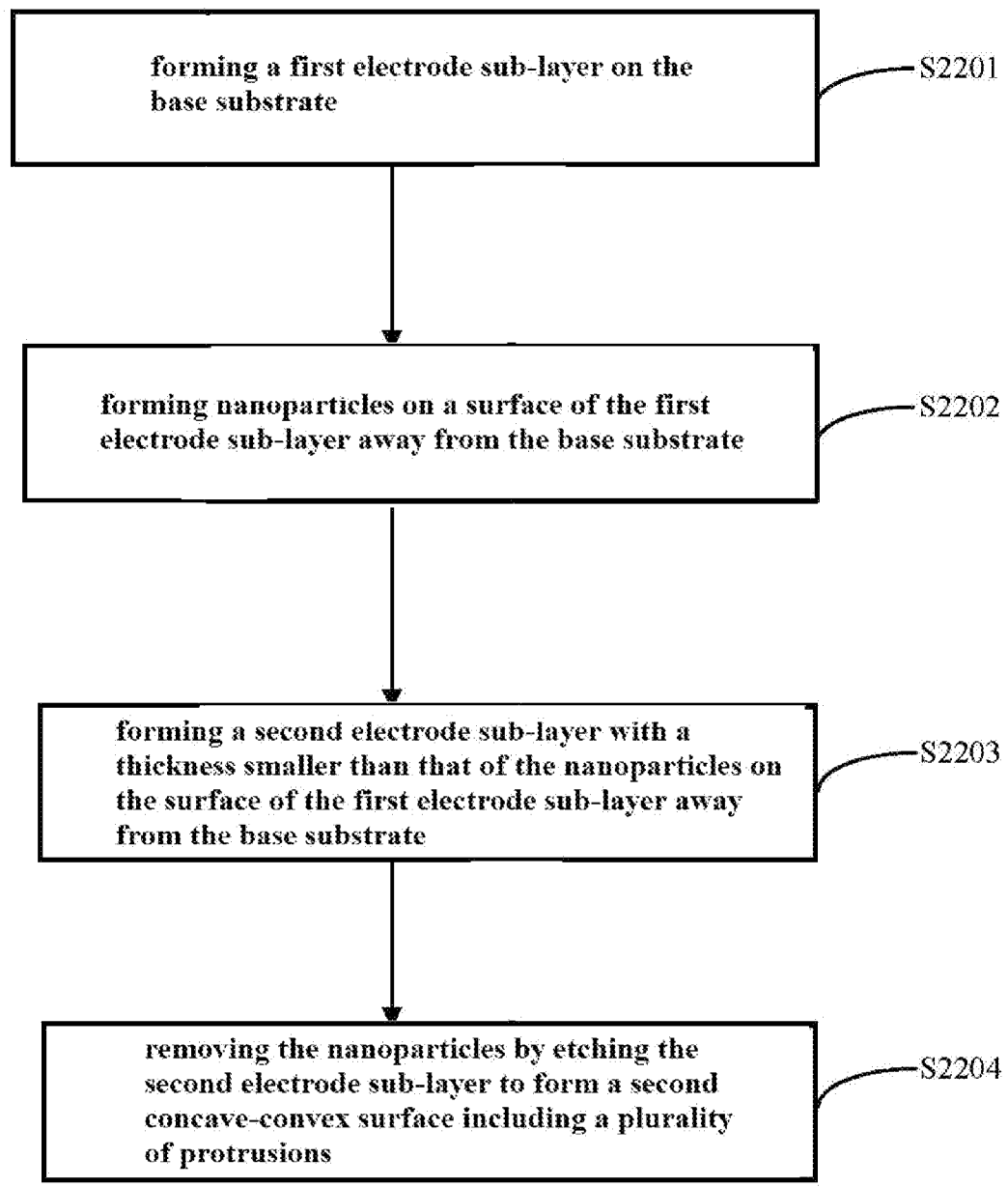
FIG. 7A is a flowchart of a method of forming a surface of a second electrode sub-layer away from a base substrate into a second concave-convex surface including a plurality of protrusions in FIG. 6.
Figure 7B:
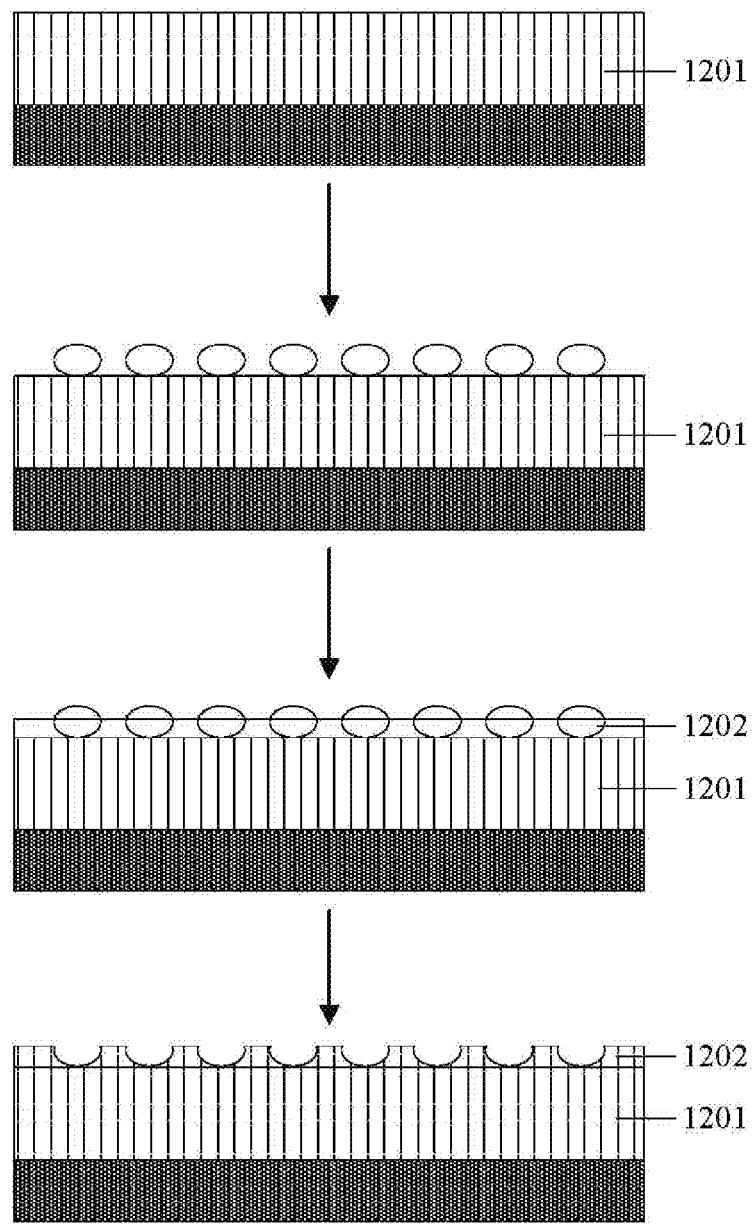
FIG. 7B shows schematic structure diagrams of forming a light-emitting diode device in one-to-one correspondence with steps of the method in FIG. 7A.

FIG. 7A is a flowchart of a method of forming the surface of the second electrode sub-layer away from the base substrate into a second concave-convex surface including a plurality of protrusions. As shown in FIG. 7A, the above step S220 can be realized through steps S2201-S2204. FIG. 7B, for example, shows the structures of the light-emitting diode device in the manufacturing process corresponding to the steps S2201-S2204.

S2201: forming a first electrode sub-layer on the base substrate.

For example, as shown in FIG. 7B, a first electrode sub-layer 1201 is formed on the base substrate.

S2202: forming nanoparticles on a surface of the first electrode sub-layer away from the base substrate.

For example, as shown in FIG. 7B, nanoparticles are formed on the surface of the first electrode sub-layer 1201 away from the base substrate. For example, the nanoparticles may adopt polystyrene or silicon, for example, polystyrene balls (i.e., PS balls) or silicon balls may be coated on the first electrode layer 110 by using a coating process.

S2203: forming a second electrode sub-layer with a thickness smaller than that of the nanoparticles on the surface of the first electrode sub-layer away from the base substrate.

For example, as shown in FIG. 7B, the second electrode sub-layer 1202 is formed with a thickness smaller than that of the nanoparticles on the surface of the first electrode sub-layer 1201 away from the base substrate.

For example, the thickness of the second electrode sub-layer as formed is 5 nm to 10 nm, such as 7 nm or 8 nm.

S2204: removing the nanoparticles by etching the second electrode sub-layer to form a second concave-convex surface including a plurality of protrusions.

For example, as shown in FIG. 7B, the nanoparticles in the second electrode sub-layer 1202 are etched and removed. For example, a solution that can dissolve nanoparticles but does not dissolve the second electrode sub-layer 1202 is used to remove the nanoparticles (for example, tetrahydrofuran, dimethylformamide or acetone can be used to remove polystyrene by etching, and hydrofluoric acid, sodium hydroxide, borohydride, toluene, dichloromethane and the like can be used to remove silicon balls by etching).

Therefore, a surface Plasmon effect is generated in a local area of the surface of the second electrode sub-layer 1202 in contact with the quantum dot transport layer 130, which causes a local electromagnetic field to be enhanced, shortens the radiation life of the excitons in the quantum dot light-emitting layer, and further avoids Auger recombination.

It should be noted that the second electrode sub-layer 1202 may be made of the same material as or different material from that of the first electrode sub-layer 1201. The second electrode sub-layer 1202 can be made of an alloy material containing two metals (e.g., Au—Ag alloy) to obtain stronger resonance, resulting in shorter exciton radiation lifetime.

It should be noted that, the steps applied to the first electrode sub-layer 1201 in the method shown in FIG. 7A can also be adaptively applied to the surface where the electron transport layer 130 is in contact with the quantum dot light-emitting layer 140 in the structure shown in FIG. 1A. For example, the step S130 in the method shown in FIG. 5 is realized by forming nanoparticles on the surface of the electron transport layer 130 away from the base substrate, forming a metal layer with a thickness smaller than that of the nanoparticles on the surface of the electron transport layer 130 away from the base substrate, and removing the nanoparticles by etching the electron transport layer 130.

Figure 8A:
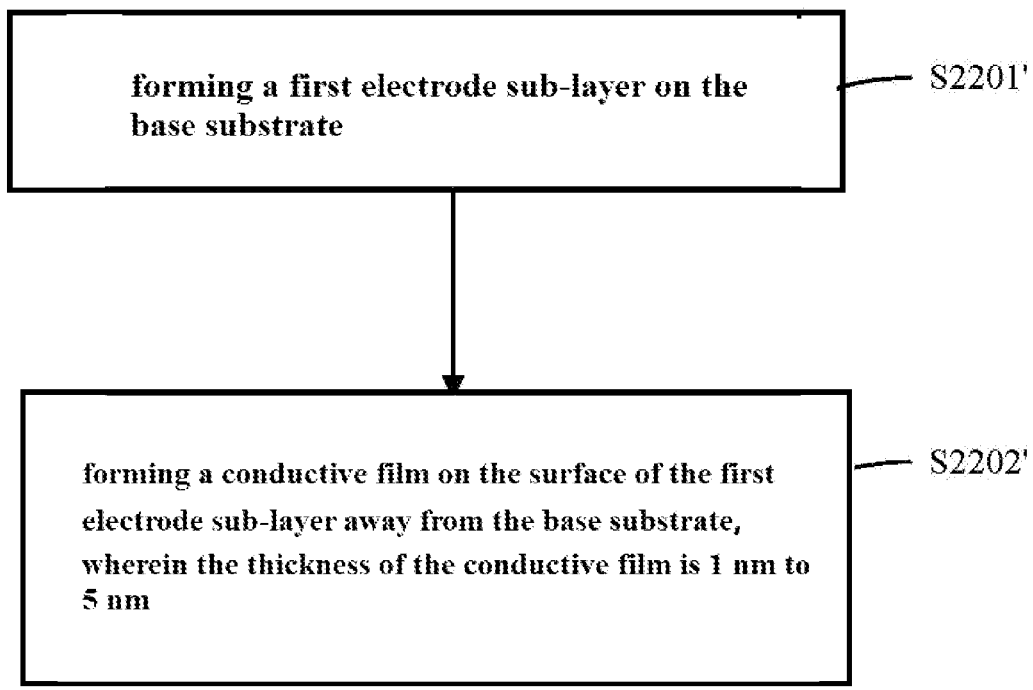
FIG. 8A is a flowchart of another method of forming the surface of the second electrode sub-layer away from the base substrate into the second concave-convex surface including a plurality of protrusions in FIG. 6.

For example, FIG. 8A is a flowchart of another method of forming the surface of the second electrode sub-layer away from the base substrate into a second concave-convex surface including a plurality of protrusions in FIG. 6. As shown in FIG. 8A, the above step S220 is realized by steps S2201'-S2202'. For example, FIG. 8B shows structures of the light-emitting diode device in the manufacturing process in one-to-one correspondence with the steps S2201'-S2202'.

Step S2201', forming a first electrode sub-layer on the base substrate.

Figure 8B:
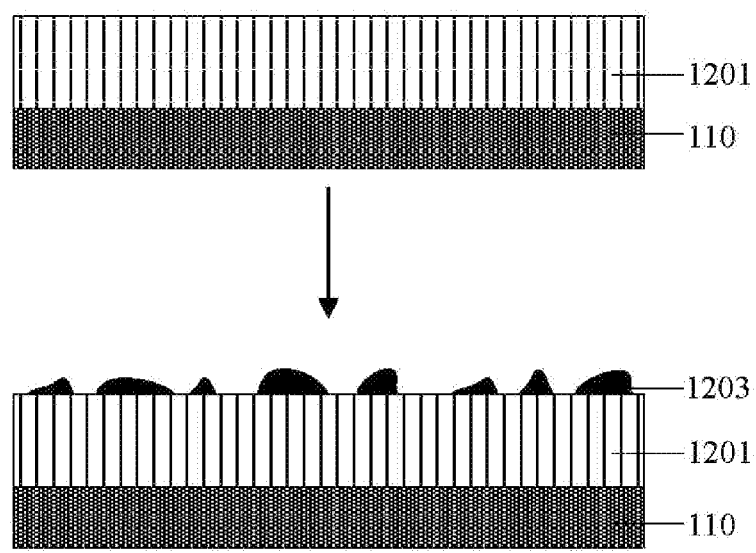
FIG. 8B shows schematic structure diagrams of forming the light-emitting diode device in one-to-one correspondence with the steps of the method in FIG. 8A.

As shown in FIG. 8B, a first electrode sub-layer 1201 is formed on the base substrate.

Step S2202', forming a conductive film on the surface of the first electrode sub-layer away from the base substrate. The thickness of the conductive film is 1 nm to 5 nm.

For example, an evaporation process can be used to form a conductive film on the surface of the first electrode sub-layer away from the base substrate, and the thickness of the conductive film is 1 nm to 5 nm to expose a part of the first electrode sub-layer, thereby forming a second concave-convex surface including a plurality of protrusions.

For example, the material of the conductive film may be gold (Au) or silver (Ag), etc. An extremely thin (e.g., having a thickness of 1 nm –5 nm) conductive film can be formed by using an evaporation process, so that the conductive film does not completely cover the surface of the first electrode sub-layer away from the base substrate, thereby exposing a part of the first electrode sub-layer. The island structures on the first electrode sub-layer as shown in FIG. 8B are the above-mentioned plurality of protrusions.

It should be noted that, the steps applied to the first electrode sub-layer 1201 in the method shown in FIG. 8A can also be adaptively applied to the surface where the electron transport layer 130 is in contact with the quantum dot light-emitting layer 140 in the structure shown in FIG. 1A. For example, the step S130 in the method shown in FIG. 5 is realized by forming a conductive film with a thickness of 1 nm to 5 nm on the surface of the electron transport layer 130 in contact with the quantum dot light-emitting layer 140 by using an evaporation process, and exposing a part of the electron transport layer 130.

For example, FIG. 9A is a flowchart of another method of forming the surface of the second electrode sub-layer away from the base substrate into a second concave-convex surface including a plurality of protrusions in FIG. 6. As shown in FIG. 9A, the above step S220 is realized by steps S2201"-S2202". For example, FIG. 9B shows structures of the light-emitting diode device in the manufacturing process in one-to-one correspondence with the steps S2201"-S2202".

Step S2201", forming a first electrode sub-layer on the base substrate.

As shown in FIG. 9B, a first electrode sub-layer 1201 is formed on the base substrate.

S2202", forming conductive nanoparticles on a surface of the first electrode sub-layer away from the base substrate to form a second concave-convex surface including a plurality of protrusions.

As shown in FIG. 9B, conductive nanoparticles are formed on the surface of the first electrode sub-layer 1201 away from the base substrate. For example, the thickness of the conductive nanoparticle is 1 nm to 10 nm, that is, the diameter of the conductive nanoparticle can be 1 nm to 10 nm.

For example, the material of the conductive nanoparticles may be gold (Au) or silver (Ag), etc. For example, conductive nanoparticles may be coated on the first electrode layer 110 by using a coating process.

For example, the second concave-convex surface can be formed in the manner described above in connection with FIGS. 7A-9B, with the root-mean-square surface roughness ranging from 5 nm to 10 nm. The plurality of protrusions of the second concave-convex surface can also be formed with a height ranging from 1 nm to 10 nm.

It should be noted that the steps applied to the first electrode sub-layer 1201 in the method shown in FIG. 9A can also be adaptively applied to the surface where the electron transport layer 130 is in contact with the quantum dot light-emitting layer 140 in the structure shown in FIG. 1A. For example, the step S130 in the method shown in FIG. 5 is realized by forming conductive nanoparticles on the surface of the electron transport layer 130 away from the base substrate.

In addition, referring to FIG. 6, in the step S230, an electron transport layer can be formed by sputtering or spin-coating on the second concave-convex surface by using a sputtering process or a spin-coating process. If the sputtering process is selected in this step, a doped zinc oxide film doped with magnesium ions and trivalent metal ions can be formed as the electron transport layer by using the sputtering process, and the trivalent metal ions can be aluminum ions. For example, the mass percentage of doped magnesium ions is controlled to be 0.5%~20%, such as 5%, 10% or 15%, and the mass percentage of doped aluminum ions is controlled to be 0.5%~10%, such as 2%, 5% or 7%, and one selected from the group consisted of ZnMgAlO sputtering, co-sputtering of ZnMgO and Al2O3, and co-sputtering of ZnAlO and MgO can be used.

Figure 10:
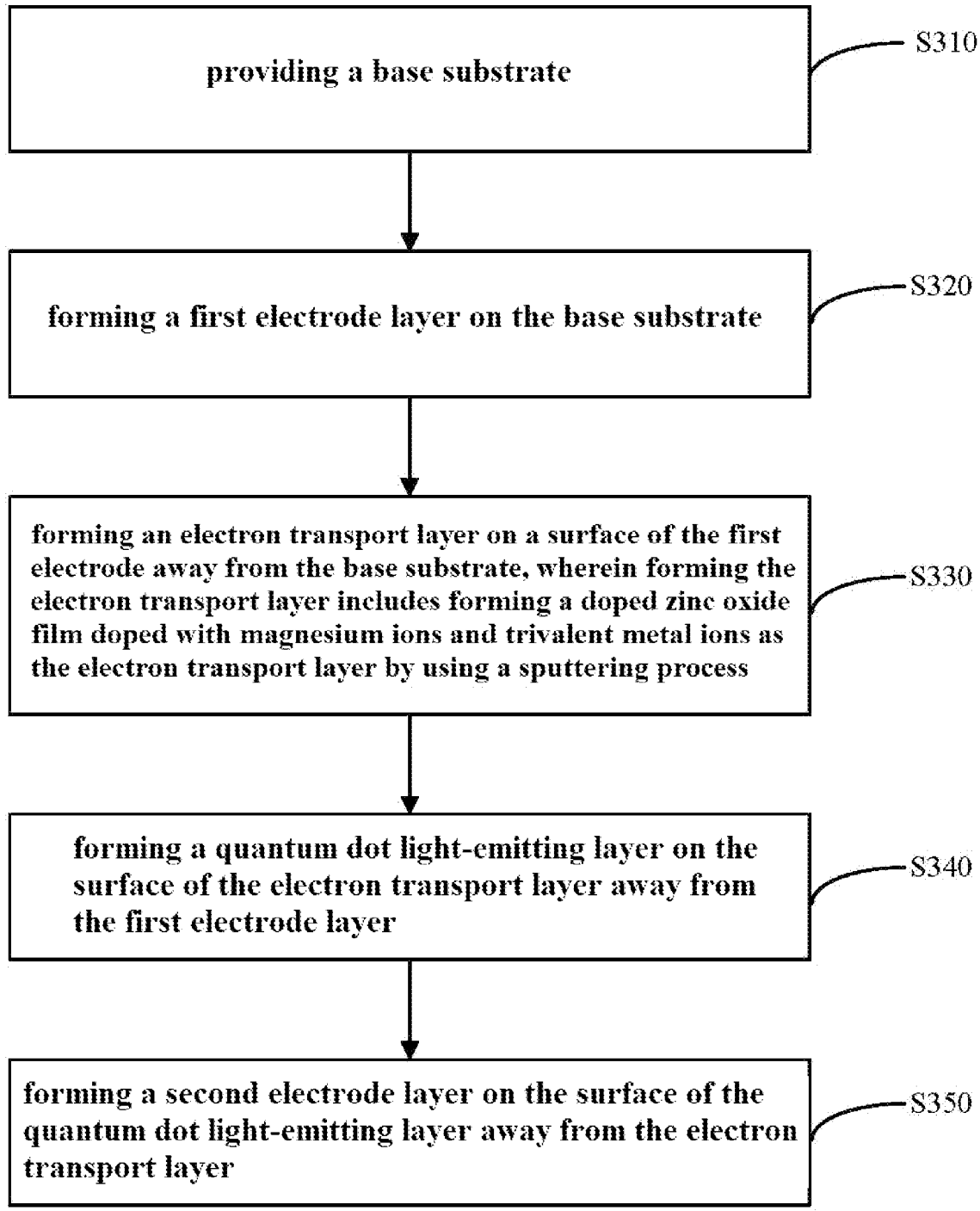
FIG. 10 is a flowchart of another manufacturing method of a light-emitting diode device provided by at least one embodiment of the present disclosure.

For example, FIG. 10 is a flowchart of another manufacturing method of a light-emitting diode device according to an embodiment of the present disclosure. As shown in FIG. 10, the manufacturing method includes steps S310-S350.

Step S310, providing a base substrate.

For example, the base substrate may be a glass substrate, a quartz substrate, or a flexible PET (polyethylene terephthalate) substrate.

Step S320, forming a first electrode layer on the base substrate.

For example, the first electrode layer may be a transparent electrode made of ITO (indium tin oxide), FTO (fluorine doped tin oxide) or conductive polymer, or, the first electrode layer may be an opaque electrode, for example, a metal electrode such as an aluminum electrode or a silver electrode.

Step S330, forming an electron transport layer on a surface of the first electrode away from the base substrate, wherein forming the electron transport layer includes forming a doped zinc oxide film doped with magnesium ions and trivalent metal ions as the electron transport layer by using a sputtering process.

Step S340, forming a quantum dot light-emitting layer on the surface of the electron transport layer away from the first electrode layer.

Step S350, forming a second electrode layer on the surface of the quantum dot light-emitting layer away from the electron transport layer.

Therefore, by using the doped zinc oxide film doped with magnesium ions and trivalent metal ions (for example, aluminum (Al) ions, indium (In) ions, gallium (Ga) ions, etc.) as the electron transport layer, the electron transport layer can have more matching energy levels, more appropriate conductivity and better stability with respect to the quantum dot light-emitting layer.

For example, in some examples, the trivalent metal ion used in step S330 is aluminum ion, and the mass percentage of doped magnesium ion and doped aluminum ion in the doped zinc oxide film is 0.5%-20% and 0.5%-10% respectively, and the doped zinc oxide film can be formed by one selected from the group consisted of ZnMgAlO sputtering, co-sputtering of ZnMgO and Al2O3, and co-sputtering of ZnAlO and MgO.

For example, in some examples, the manufacturing method of the light-emitting diode device further includes: roughening the surface of the electron transport layer away from the first electrode layer by a plasma etching or sand blasting process, so that the RMS surface roughness of the surface of the electron transport layer away from the first electrode layer ranges from 5 nm to 10 nm. For example, the plasma etching process can be a dry etching process such as Reactive Ion Etching (RIE) and Inductively Coupled Plasma (ICP) etching process, and argon or oxygen plasma is used as the reaction gas for etching. The sand blasting process can be performed by using ceramic sand, quartz sand and other materials.

Therefore, in the above embodiment, the roughness of the surface of the electron transport layer in contact with the quantum dot light-emitting layer 120 is high, and the contact area between the electron transport layer and the quantum dot light-emitting layer is large, so that the problems of less electron injection, unbalanced carriers and the like caused by the accumulation of nanoparticle quantum dots on the flat surface of the sputtered zinc oxide film can be avoided, and the electric leakage caused by the direct contact between the electron transport layer and the hole transport layer caused by the accumulation of nanoparticle quantum dots on the flat surface of the sputtered zinc oxide film can be avoided.

The following points need to be explained:
(1) In the drawings of the embodiments of the present disclosure, only the structures related to the embodiments of the present disclosure are involved, and other structures can refer to the general design.
(2) The features of the same embodiment and different embodiments of the present disclosure can be combined with each other without conflict.

The above is only an exemplary embodiment of the present disclosure, and it is not intended to limit the scope of protection of the present disclosure, which is determined by the appended claims.

Although the present disclosure has been described in details with general description and specific embodiments, it is obvious to those skilled in the art that some modifications or improvements can be made based on the embodiments of the present disclosure. Therefore, these modifications or improvements made without departing from the spirit of the present disclosure belong to the scope of protection sought to be protected by the present disclosure.

What is claimed is:
1. A light-emitting diode device, comprising:
a base substrate;
a first electrode layer laminated on the base substrate;
an electron transport layer laminated on a surface of the first electrode layer away from the base substrate;
a quantum dot light-emitting layer laminated on a surface of the electron transport layer away from the first electrode layer; and
a second electrode layer laminated on a surface of the quantum dot light-emitting layer away from the electron transport layer;
wherein the surface of the electron transport layer away from the first electrode layer is a first concave-convex surface including a plurality of protrusions,
wherein the surface of the first electrode layer away from the base substrate is a second concave-convex surface including a plurality of protrusions, and
wherein the first electrode layer comprises a first electrode sub-layer and conductive nanoparticles disposed on the first electrode sub-layer, and the conductive nanopar- ticles constitute the plurality of protrusions of the second concave-convex surface.

2. The light-emitting diode device according to claim 1, wherein a root-mean-square surface roughness of the first concave-convex surface ranges from 5 nm to 10 nm.

3. The light-emitting diode device according to claim 2, wherein a height of the plurality of protrusions included in the first concave-convex surface in a direction perpendicular to the base substrate ranges from 1 nm to 10 nm.

4. The light-emitting diode device according to claim 1, wherein the plurality of protrusions included in the second concave-convex surface have the same shape as the plurality of protrusions included in the first concave-convex surface, and the plurality of protrusions included in the second concave-convex surface have the same height as the plurality of protrusions included in the first concave-convex surface in a direction perpendicular to the base substrate.

5. The light-emitting diode device according to claim 1, wherein the electron transport layer comprises a doped zinc oxide film doped with magnesium ions and trivalent metal ions.

6. The light-emitting diode device according to claim 5, wherein the trivalent metal ions are aluminum ions,
in the doped zinc oxide film, a mass percentage of doped magnesium ions is 0.5%-20%, and a mass percentage of doped aluminum ions is 0.5%-10%.

7. The light-emitting diode device according to claim 1, wherein the electron transport layer comprises N+1 electron transport sub-layers and N electron blocking sub-layers,
the N electron blocking sub-layers are sandwiched between the N+1 electron transport sub-layers, and N is a positive integer greater than or equal to 2, and
among the N+1 electron transport sub-layers, a surface of the electron transport sub-layer farthest from the base substrate that is away from the base substrate is the first concave-convex surface, and materials of the N+1 electron transport sub-layers are the same, and materials of the N electron blocking sub-layers are different from the materials of the N+1 electron transport sub-layers.

8. A display panel, comprising:
a base substrate; and
a plurality of sub-pixels arranged in an array on the base substrate, wherein each of the plurality of sub-pixels comprises the light-emitting diode device according to claim 1,
the display panel further comprises a pixel defining layer, wherein the pixel defining layer is arranged on the surface of the electron transport layer away from the base substrate and comprises a plurality of openings, wherein the pixel defining layer at least partially covers an edge of the electron transport layer, the plurality of openings respectively expose a middle part of the electron transport layer, and the quantum dot light-emitting layer is arranged at least in the plurality of openings.

9. A manufacturing method of a light-emitting diode device, comprising:
providing a base substrate;
forming a first electrode layer on the base substrate;
forming an electron transport layer on a surface of the first electrode layer away from the base substrate;
forming a quantum dot light-emitting layer on a surface of the electron transport layer away from the first electrode layer; and forming a second electrode layer on a surface of the quantum dot light-emitting layer away from the electron transport layer,
wherein forming the electron transport layer comprises:
forming the surface of the electron transport layer away from the first electrode layer into a first concave-convex surface including a plurality of protrusions,
wherein forming the surface of the electron transport layer away from the first electrode layer into the first concave-convex surface including the plurality of protrusions comprises:
forming the first electrode layer including a first electrode sub-layer and a second electrode sub-layer laminated in sequence on the base substrate, and forming a surface of the second electrode sub-layer away from the base substrate into a second concave-convex surface including a plurality of protrusions; and
forming the electron transport layer on the second concave-convex surface by using a sputtering process or a spin-coating process, so that the surface of the electron transport layer away from the first electrode layer is formed into the first concave-convex surface including the plurality of protrusions, and
wherein forming the surface of the second electrode sub-layer away from the base substrate into the second concave-convex surface including a plurality of protrusions comprises:
forming nanoparticles on the surface of the first electrode sub-layer away from the base substrate;
forming the second electrode sub-layer with a thickness smaller than that of the nanoparticles on the surface of the first electrode sub-layer away from the base substrate; and
removing the nanoparticles by etching the second electrode sub-layer to form the second concave-convex surface including a plurality of protrusions.

10. The manufacturing method according to claim 9, wherein the thickness of the second electrode sub-layer is 5 nm-10 nm.

11. The manufacturing method according to claim 9, wherein forming a surface of the second electrode sub-layer away from the base substrate into a second concave-convex surface including a plurality of protrusions comprises:
forming a conductive film on the surface of the first electrode sub-layer away from the base substrate by adopting an evaporation process, wherein a thickness of the conductive film is 1 nm-5 nm so that the conductive film exposes a part of the first electrode sub-layer, thereby forming the second concave-convex surface including a plurality of protrusions.

12. The manufacturing method according to claim 9, wherein forming a surface of the second electrode sub-layer away from the base substrate into a second concave-convex surface including a plurality of protrusions comprises:
forming conductive nanoparticles on the surface of the first electrode sub-layer away from the base substrate to form the second concave-convex surface including a plurality of protrusions, wherein a thickness of the conductive nanoparticle is 1 nm-10 nm.

13. The manufacturing method according to claim 9, wherein forming the electron transport layer on the second concave-convex surface by using a sputtering process or a spin-coating process comprises:
forming a doped zinc oxide film doped with magnesium ions and trivalent metal ions on the second concave-convex surface by a sputtering process as the electron transport layer.

14. The manufacturing method according to claim 13, wherein the trivalent metal ions are aluminum ions, and mass percentages of doped magnesium ions and doped aluminum ions in the doped zinc oxide film are 0.5%-20% and 0.5%-10%, respectively, and
    the doped zinc oxide film is formed by one selected from the group consisted of ZnMgAlO sputtering, co-sputtering of ZnMgO and Al2O3, and co-sputtering of ZnAlO and MgO.

* * * * *